United States Patent
Shih et al.

(10) Patent No.: US 8,265,436 B2
(45) Date of Patent: Sep. 11, 2012

(54) BONDING SYSTEM FOR OPTICAL ALIGNMENT

(75) Inventors: Chih-Tsung Shih, Hsinchu (TW); Chien-Jen Sun, Hsinchu County (TW); Jerry Chien, Chiayi County (TW); Chu-Liang Cheng, Taipei County (TW); Yi-Jen Chan, Taoyuan County (TW)

(73) Assignees: Industrial Technology Research Institute, Hsinchu (TW); Elite Advanced Laser Corporation, Taipei Hsien (TW)

( * ) Notice: Subject to any disclaimer, the term of this patent is extended or adjusted under 35 U.S.C. 154(b) by 133 days.

(21) Appl. No.: 12/778,127

(22) Filed: May 12, 2010

(65) Prior Publication Data

US 2011/0280511 A1 Nov. 17, 2011

(51) Int. Cl.
*G02B 6/26* (2006.01)
*G02B 6/12* (2006.01)
*H01L 33/48* (2010.01)

(52) U.S. Cl. .............. 385/52; 385/14; 385/92; 385/129; 438/27; 257/E33.056

(58) Field of Classification Search .................... 385/14, 385/31, 49, 52, 88, 92, 94, 129, 130, 131, 385/132; 156/60; 438/27; 257/E33.056
See application file for complete search history.

(56) References Cited

U.S. PATENT DOCUMENTS

| | | | |
|---|---|---|---|
| 5,966,486 A | 10/1999 | Boudreau et al. | |
| 6,366,468 B1 | 4/2002 | Pan | |
| 6,457,811 B1 | 10/2002 | Pan et al. | |
| 6,533,391 B1 | 3/2003 | Pan | |
| 6,643,434 B2 * | 11/2003 | Cayrefourcq et al. | 385/52 |
| 2004/0017977 A1 | 1/2004 | Lam et al. | |
| 2004/0217366 A1 | 11/2004 | Gale et al. | |
| 2004/0247248 A1 * | 12/2004 | Fasham | 385/52 |
| 2006/0007972 A1 | 1/2006 | Ericson et al. | |
| 2007/0110361 A1 * | 5/2007 | Harden et al. | 385/14 |
| 2011/0280511 A1 * | 11/2011 | Shih et al. | 385/14 |

FOREIGN PATENT DOCUMENTS

| | | |
|---|---|---|
| EP | 0466134 | 1/1992 |
| EP | 0984533 | 3/2000 |
| GB | 2395066 | 5/2004 |
| KR | 20040090660 | 10/2004 |
| WO | 9411930 | 5/1994 |

OTHER PUBLICATIONS

Hutter et al., "High Precision Passive Alignment Flip Chip Assembly Using Self-alignment and Micromechanical Stops", 2004 Electronics Packaging Technology Conference, IEEE, p. 385-389.

* cited by examiner

*Primary Examiner* — Brian Healy
(74) *Attorney, Agent, or Firm* — Jianq Chyun IP Office

(57) ABSTRACT

A bonding system and a bonding method for alignment are provided. An optical semiconductor includes a light source and a plurality of protruded elements on a surface thereof. A semiconductor bench includes a light receiving element and a plurality of recess elements on a surface thereof. A sidewall of the protruded elements or a sidewall of the recess elements is slanted. A first metallized layer is disposed on a bonding surface of each protruded element and a second metallized layer is disposed on a bottom surface of each recess element, wherein the first metallized layer is used for bonding with the second metallized layer.

24 Claims, 7 Drawing Sheets

BONDING SYSTEM FOR OPTICAL ALIGNMENT

BACKGROUND

1. Field of the Disclosure

The present disclosure relates to a bonding system and a bonding method, and more particularly to a bonding system for optical alignment and a bonding method for coupling an optical semiconductor with an optical waveguide.

2. Description of Related Art

In the field of computer and communication, the demands on high transmission speed and compactness of a product are the driving force for replacing the traditional electronic transmission with optical transmission. There are various products and technologies that are or are evolving to be the mainstreams in the market, and examples of such include optical USB, silicon transceiver and silicon photonics, in which data is transferred among devices by optical rays.

In an optoelectronic system, such as those discussed above, it is customary that a LD (laser diode) chip and a silicon waveguide are optically coupled together. In order to achieve a 50% coupling efficiency between the LD chip and the silicon waveguide, the alignment tolerance is required to be within 1 μm (micron). Conventionally, a LD chip is optically coupled to an optical waveguide formed on a substrate by monitoring the intensity of light outputted from the optical fiber in an oscillating state of the LD chip. The position of the optical waveguide is adjusted such that the amount of light is maximized. However, this type of active alignment techniques is labor-intensive and the equipments are expensive and complicated.

Accordingly, passive alignment techniques are developed in which a LD chip and an optical fiber are disposed at specific positions, and an operation is performed to mount and to couple the LD chip and the optical fiber together. Although there are existing bonding platforms capable to achieve the tolerance requirement, these machines are also expensive and the throughput is low.

It has been demonstrated that the overall cost of all optoelectronic systems is dominated by the packaging, and alignment is the major contribution of the packaging cost. Hence, it is critical to provide a cost-effective assembly process for accelerating the growth of optoelectronic technologies and the yield of optoelectronic products.

SUMMARY OF THE DISCLOSURE

The present disclosure is directed to a bonding system for alignment of an optical semiconductor to an optical waveguide, wherein the alignment tolerance is within ±1 μm.

The present disclosure is also directed to a bonding method for coupling an optical semiconductor to an optical waveguide, wherein a cost-effective assembly process is provided and the throughput is significantly enhanced.

The present disclosure provides a bonding system for alignment including an optical semiconductor and a semiconductor bench. The optical semiconductor includes a light source and a plurality of protruded elements on a surface of the optical semiconductor. The semiconductor bench includes a light receiving element and a plurality of recess elements, wherein at least a sidewall of each protruded element or a sidewall of each recess element is slanted. Moreover, a first metallized layer is formed on the bonding surface of each protruded element, while a second metallized layer is formed on the bottom surface of each recess element, wherein the first metallized layer is used to bond with the second metallized layer.

According to an aspect of the disclosure, the sidewall of each protruded element or the sidewall of each recess element forms an acute angle with the surface of the optical semiconductor or the surface of the semiconductor bench.

According to an aspect of the disclosure, a material of the first metallized layer and the second metallized layer includes a eutectic solder material.

According to an aspect of the disclosure, a depth of each recess element is less than or equal to 100 μm.

According to an aspect of the disclosure, a side of the bonding surface of each protruded element is less than or equal to 50 μm.

According to an aspect of the disclosure, the optical semiconductor includes a laser diode chip or a laser array chip.

According to an aspect of the disclosure, the light receiving element includes an optical waveguide or an optical fiber.

The present disclosure further provides a bonding method for coupling an optical semiconductor to an optical waveguide. The method includes providing an optical semiconductor and a semiconductor bench. The optical semiconductor is formed with a light emission element and a plurality of protruded elements. A first metallized layer is formed on a bonding surface of each protruded element. The semiconductor bench is formed with a light receiving element and a plurality of recess elements. A second metallized layer is formed on the bottom surface of each recess element. The optical semiconductor is placed above the semiconductor bench, and a delivery force is applied such that the protruded elements respectively slide into the recess elements. A bonding process is subsequently performed for bonding the first metallized layer and the second metallized layer.

According to an aspect of the disclosure, the bonding process is a eutectic bonding process.

According to an aspect of the disclosure, the first metallized layer and the second metallized layer are formed with a eutectic solder material or a conductive adhesive.

According to an aspect of the disclosure, the protruded elements are formed by photolithograph and etching processes.

According to an aspect of the disclosure, the recess elements are formed by photolithograph and etching processes.

According to an aspect of the disclosure, at least the sidewall of each protruded element or the sidewall of each recess element forms an acute angle with the surface of the optical semiconductor or the surface of the semiconductor bench.

According to an aspect of the disclosure, the light emission element includes a laser.

According to an aspect of the disclosure, the light receiving element includes an optical waveguide or an optical fiber.

According to the disclosure, the alignment accuracy between the optical semiconductor and an optical waveguide is determined by the processing errors, for example, photolithograph and etching errors. Accordingly, the post bond alignment accuracy can be controlled to be less than 1 μm. The disclosure also provides a cost-effective batch assembly process of optical precision alignments such that the throughput on optoelectronic products is significantly enhanced.

In order to the make the aforementioned and other objects, features and advantages of the present disclosure comprehensible, a preferred embodiment accompanied with figures are described in detail below.

DESCRIPTION OF EMBODIMENTS

In the following description, reference is made to various exemplary embodiments in which the disclosure may be practiced, and it is to be understood that other embodiments may be employed without departing from the disclosure.

Figure 1A:
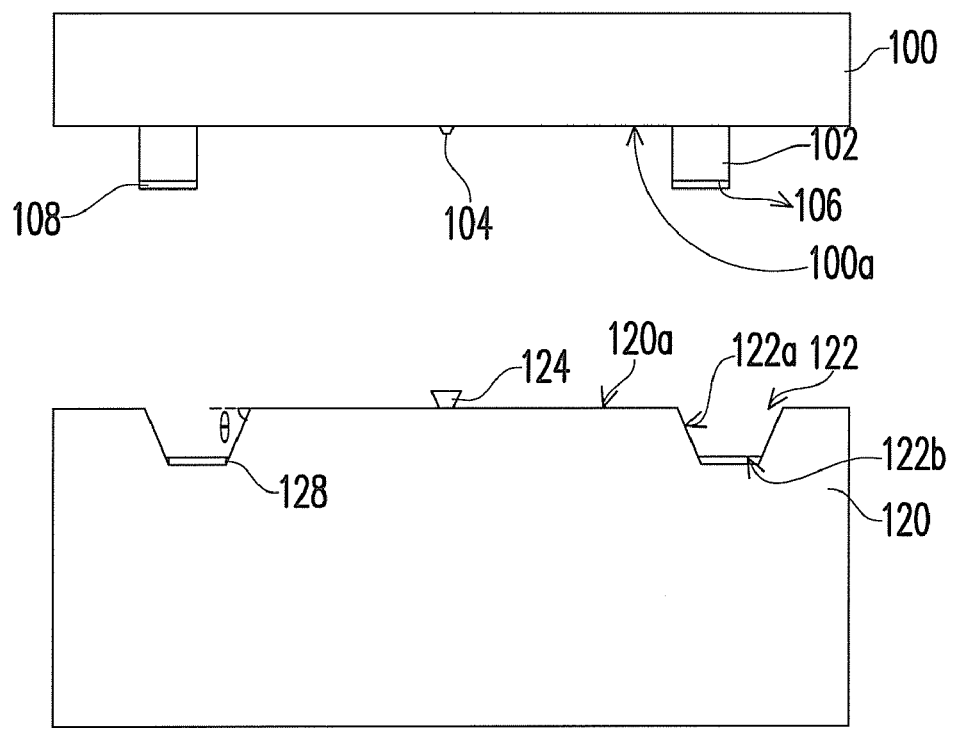
FIGS. 1A to 1C are schematic cross-sectional views illustrating a bonding system for precise alignment and a bonding method according to an exemplary embodiment of the present disclosure.
Figure 1B:
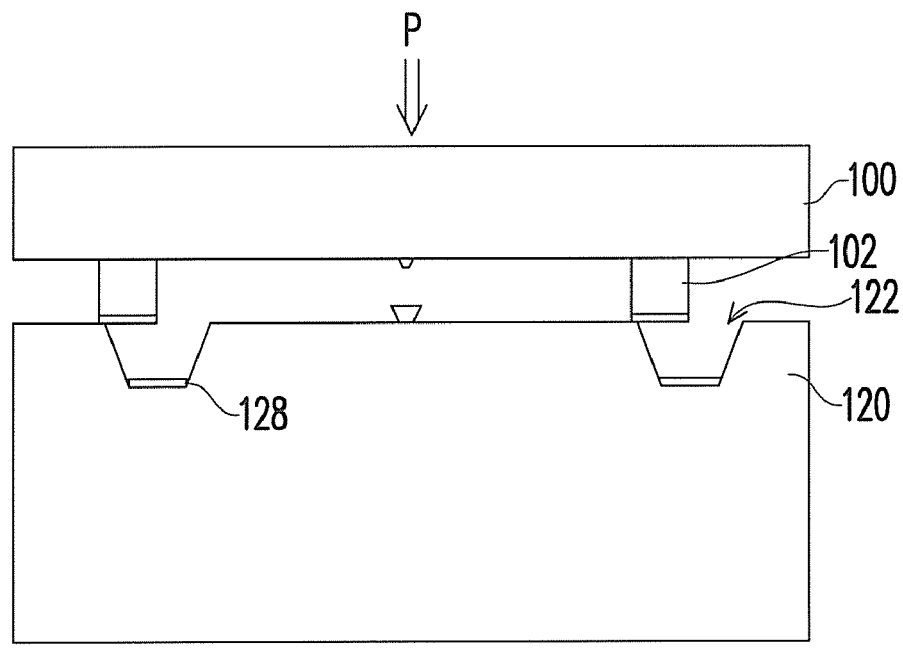
Figure 1C:
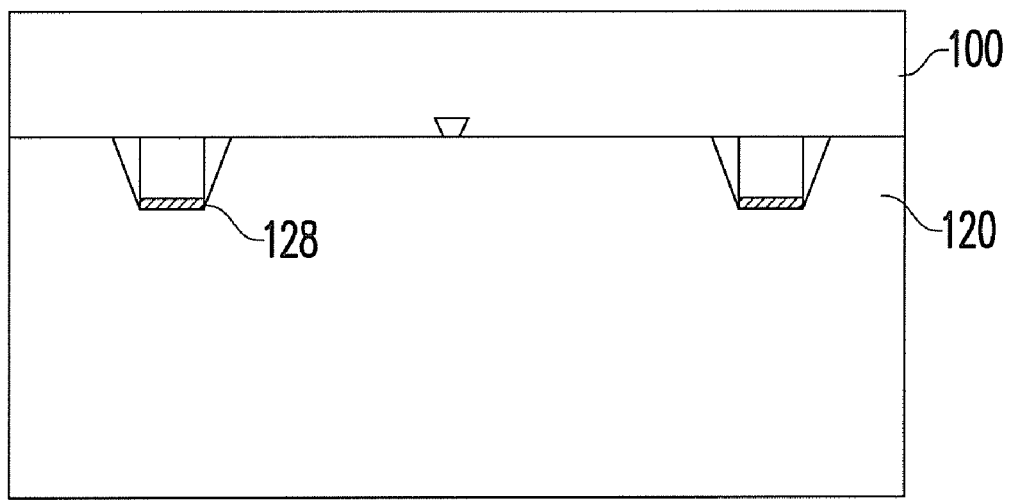
Figure 2:
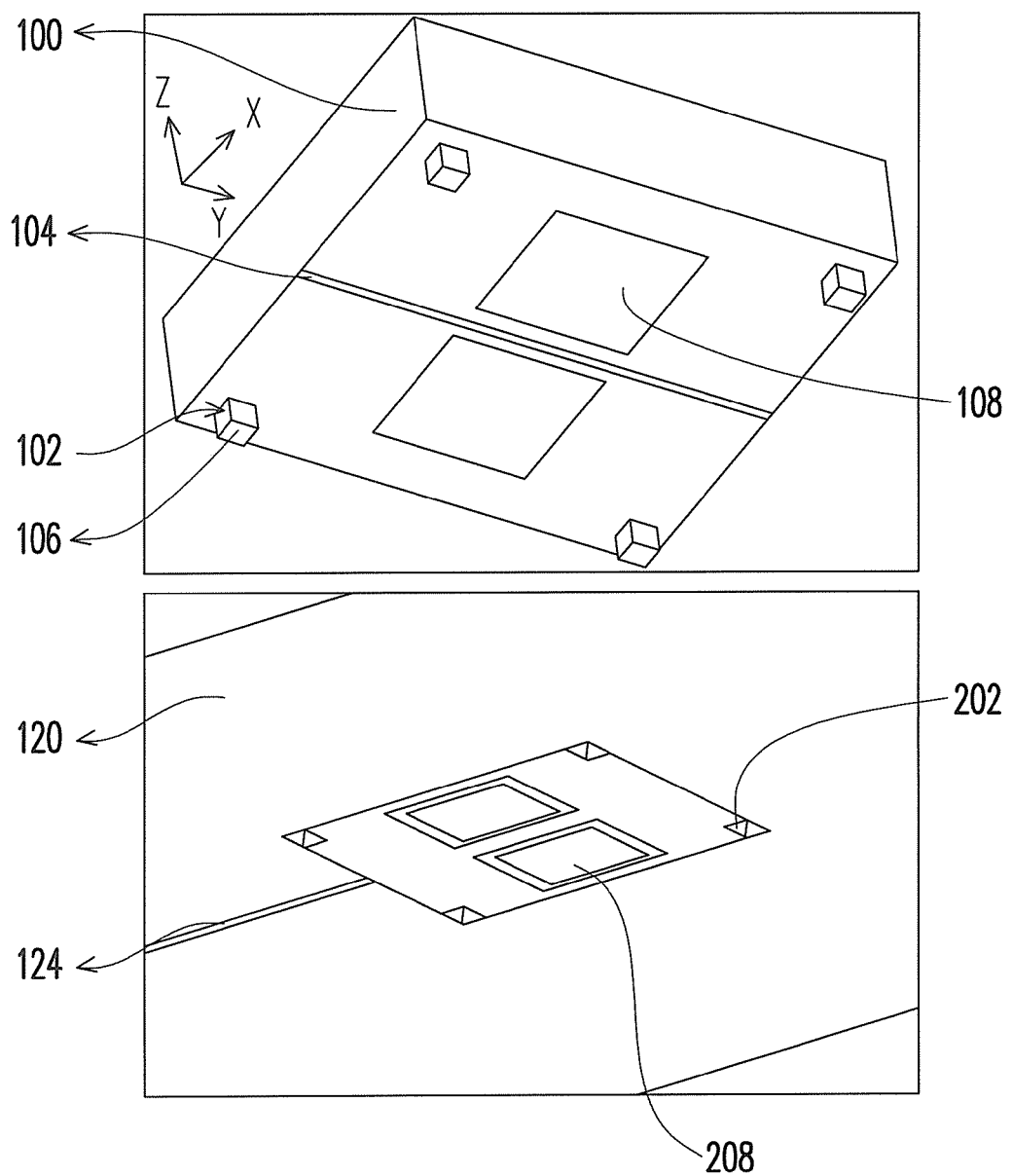
FIG. 2 is the perspective view of the optical semiconductor and the corresponding semiconductor bench according to an exemplary embodiment of the present disclosure.

FIGS. 1A to 1C are schematic cross-sectional views illustrating a bonding system for precise coupling of optoelectronic devices, such as lasers or photodetectors to corresponding optical components, such as optical waveguides or optical fibers, and a bonding method for integrating an optical semiconductor to a semiconductor bench such that the optoelectronic devices are optically aligned and coupled to the optical components according to an exemplary embodiment of the present disclosure. FIG. 2 is a perspective view of an optical semiconductor for housing an optoelectronic device and the corresponding semiconductor bench for housing an optical component. Referring to FIG. 1A and FIG. 2, an optical semiconductor 100 is provided. The optical semiconductor 100 is, for example, a laser diode chip or a laser array chip. The optical semiconductor 100 includes a plurality of protruded elements 102, configured on a mounting surface 100a and at a predetermined distance, for example, within 200 μm of a light emitting source 104. The light emitting source 104 includes but not limited to a laser. The protruded elements 102 are formed with a metal material or other silicon materials. A bonding material 108 is formed on the bonding surface 106 of each protruded element 102. The bonding material 108 includes, for example, a metallized material such as a eutectic solder material. In one exemplary embodiment, gold or a gold/tin alloy is plated on the bonding surface 106. Alternatively, the bonding surface 106 is applied with a gold-epoxy paste. In this exemplary embodiment, each protruded element 102 has the approximate shape of a rectangular cuboid, and the length of a side of the bonding surface 106 of each protruded element 102 is less than or equal to 50 μm, for example, while the height of each protruded element 102 is less than or equal to 100 μm, for example. It should be appreciated that the protruded elements 102 could have any appropriate dimensions and shapes, for example, the protruded elements could be in a shape of a cylinder, a conical frustum, other polygonal frusta. Further, although this embodiment is exemplified with four protruded elements 102 configured at four corners of the optical semiconductor 100 surrounding one light emitting element 104, it should be understood the numbers and the positions of the protruded elements 102 are not limited. For an optimum alignment result, there are at least two protruded elements 102 corresponding to one light emitting source 104, and the two protruded elements 102 are best configured diagonally with respect to the one light emitting source 104.

Still referring to FIG. 1A and FIG. 2, a semiconductor bench 120 is also provided. The semiconductor bench 120 is, for example, a silicon substrate, having a light receiving element 124, for example, an optical waveguide, configured on a mounting surface 120a thereof. The light receiving element 124 serves as an input terminal for the light emitting element 104. The semiconductor bench 120 also includes a plurality of recess elements 122 formed on the mounting surface 120a. The plurality of recess elements 122, extending downward into the semiconductor bench 120, is formed by, for example, photolithographic and etching techniques, such that the sidewall of the recess element 122 may be normal to the surface 120a of the semiconductor bench 120 or it may be slanted. In this exemplary embodiment, each recess element 122 is an angular opening in the shape of inverted square frusta, for example, wherein the size of the opening is greater at the top near the mounting surface 120a of the semiconductor bench 120 than that at the bottom. Further, the sidewalls 122a of each recess element 122 are slanted, such that the sidewall 122a of the recess element 122 intersects with the surface plane of the semiconductor bench 120 at an acute angle θ. In an exemplary embodiment, the depth of each recess element 122 is less than or equal to 100 μm, for example, and the length of a side of the recess element 122 at the top near the surface 120a is less than or equal to 150 μm, for example, while the length of a side of the recess element 122 at the bottom is less than or equal to 50 μm, for example. Additionally, a bonding material 128 is formed on the bottom surface 122b of each recess element 122. The bonding material 128 includes a metallized material, for example, a eutectic solder material. In one exemplary embodiment, gold or a gold/tin alloy is plated on the bottom surface 122b. Alternatively, gold-epoxy is applied on the bottom surface 122b.

Figure 4:
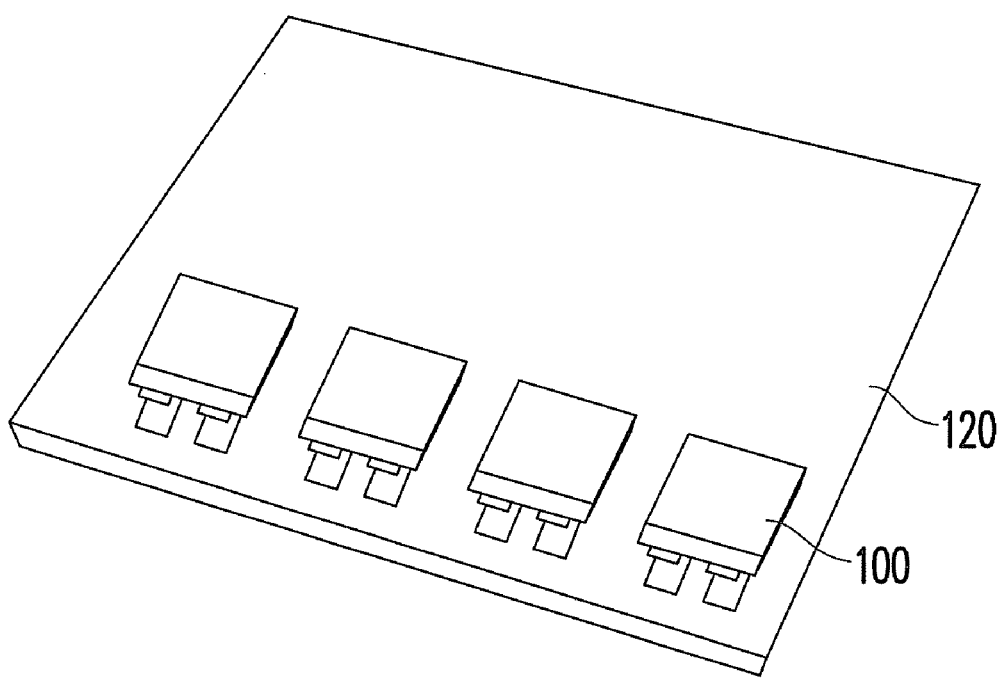
FIG. 4 is a schematic perspective view of a bonding system according an exemplary embodiment of the disclosure.

It should be appreciated the numbers and the positions of the recess elements 122 are not limited. Further, the number of the light receiving elements 124 to be optically coupled with light emitting sources 104 is not limited, either. In other words, the number of the optical semiconductors 100, for example, the number of laser diode chips, to be concurrently mounted on the semiconductor substrate 120 is not limited, as shown in FIG. 4.

Continuing to FIG. 1B, the optical semiconductor 100 is placed above the semiconductor bench 120. A pressure P is applied to the optical semiconductor 100 such that the plurality of protruded elements 102 readily slides to insert into the plurality of recess elements 122 for the bonding material 108 on the bonding surface 106 of each protruded element 102 to be in abutting contact with the bonding material 128 on the bottom surface 122b of each recess element 122. It is worthy to note that, in this exemplary embodiment, the size and the shape of the bottom surface 122b of each recess element 122 substantially match with those of bonding surface 106 of the protruded element 102. Accordingly, lateral shifting of the protruded elements 102 in the recess elements 122 is minimized, and the protruded elements 102 may be snuggly fit inside the recess elements 122.

Referring to FIG. 1C, a thermal process is performed to integrate the optical semiconductor 100 with the semiconductor bench 120 through the physical bonding of the protruded elements 102 to the recess elements 122. The thermal process includes, for example, a eutectic bonding process, performed at a temperature of about, 300 to 450° C., for example, 350° C. It should be noted that, as shown in FIG. 2, bonding pads 108 and bonding pads 128 may also be formed, respectively on the mounting surface 100a optical semiconductor 100 and on the mounting surface 120a of the semiconductor bench 120, such that the optical semiconductor 100 is more securely connected to the semiconductor bench 120. The materials for the bonding pads 108, 128 include, but not limited to, gold, gold/tin alloy and gold-epoxy.

Figure 5:
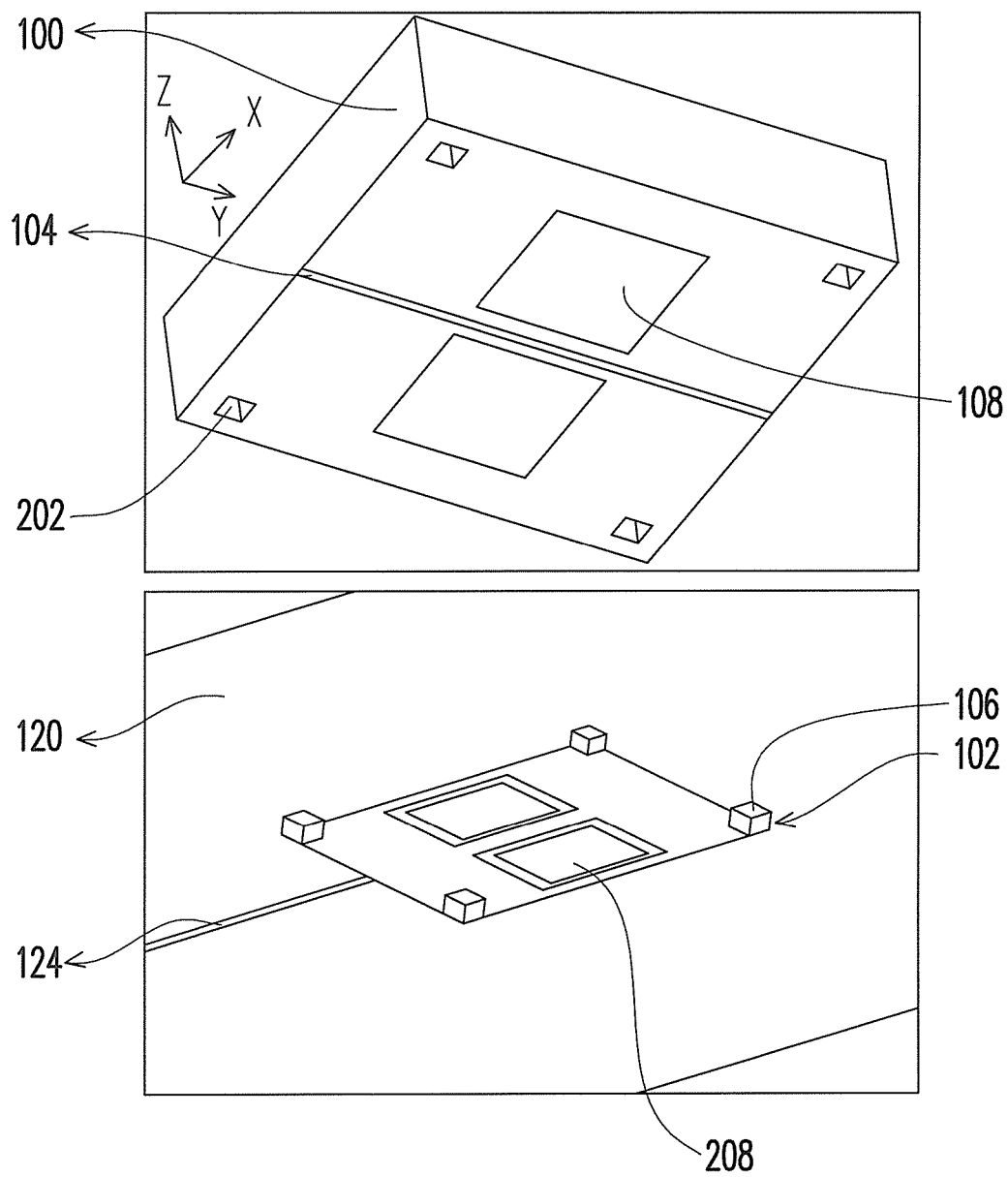
FIG. 5 is a schematic perspective view of the optical semiconductor and the corresponding semiconductor bench according to an exemplary embodiment of the present disclosure.

Although in the above exemplary embodiment, the protruded elements 102 are formed on the optical semiconductor 100 housing the optoelectronic device, such as a light emitting element 104, while the recess elements 122 are formed on the semiconductor bench 102 housing the optical components, such as light receiving element 124, it should be appreciated that the present disclosure is not limited as such. In another exemplary embodiment, as shown in FIG. 5, the protruded elements 102 may be formed on the semiconductor bench 102, while the recess elements 122 are formed on the optical semiconductor 100.

In accordance to the exemplary embodiment of the disclosure, the alignment accuracy of the optoelectronic devices, such as lasers and photodetectors to the corresponding optical components, such as optical waveguides or optical fibers is determined by the processing errors, for example, photolithograph and etching errors. Along the X-Y plane, the lithographic error is less than or equal to ±50 nm, assuming there is no error in the Z-direction. The etching error in the Z direction is less than or equal to ±0.25 µm, assuming the error along the X-Y plane is zero. Accordingly, the bonding tolerance is within ±1 µm, and hence, the post bond alignment accuracy is less than 1 µm.

Figure 3A:
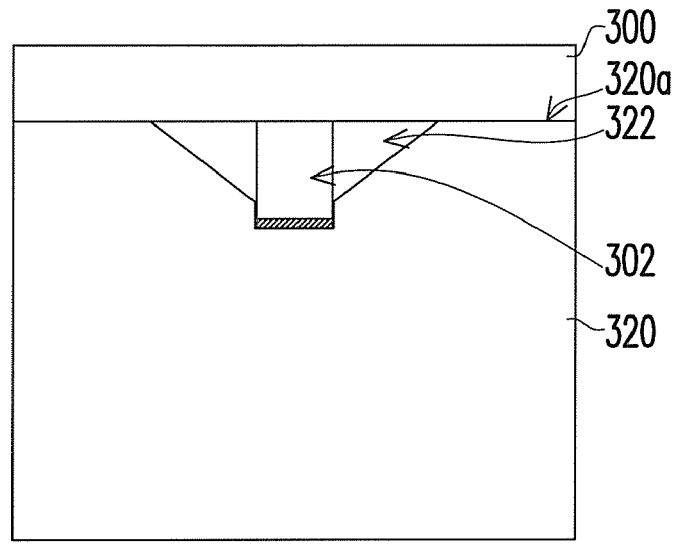
FIGS. 3A to 3C are schematic cross-sectional views respectively illustrating a bonding structure according to other exemplary embodiments of the disclosure.
Figure 3B:
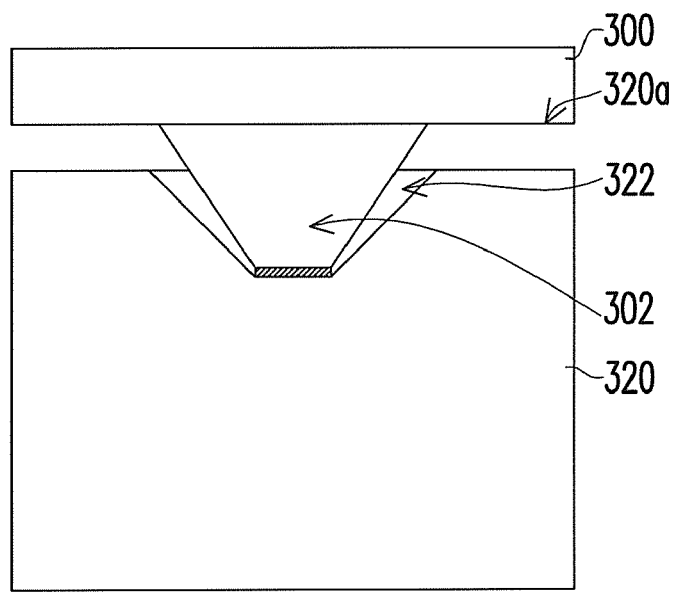
Figure 3C:
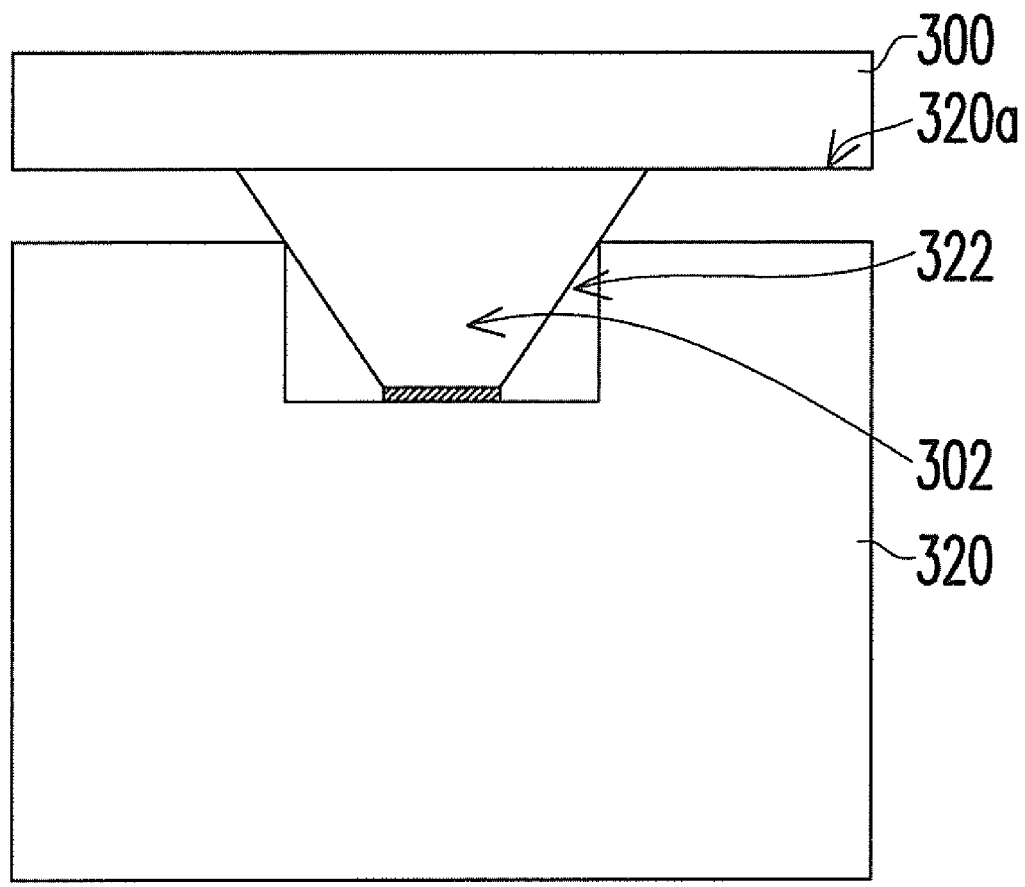

As disclosed above, the size and the shape of the protruded elements 102 and the recess elements 202 are not limited as long as they are within the scope of the disclosure. For example, according to another exemplary embodiment of the disclosure as shown in FIG. 3A, the upper sidewall of the recess element 322 is slanted to form an acute angle with the surface 320a of the semiconductor bench 320, while the lower sidewall of the recess element 322 is substantially normal to the surface 320a of the semiconductor bench 320. Hence, the protruded elements 302 could be more securely positioned in the recess elements 322. In another exemplary embodiment, as shown in FIG. 3B, the sidewall of each protruded element 302 is also slanted. In these exemplary embodiments, the depth of the recess element 322 is within 100 µm, for example, and the length of a side of the recess element 322 at the top is less than or equal to 150 µm, while the length of a side of the recess element 322 at the bottom is less than or equal to 50 µm, for example. In yet another exemplary embodiment, as shown in FIG. 3C, the sidewall of the recess element 322 is substantially straight, while the sidewall of the protruded element 302 is slanted.

According to the exemplary embodiment of the disclosure, the contour of the protruded element 302 does not necessary complement that of the recess element 322. Further, one of the sidewall of the protruded element 302 and the sidewall of the recess element 322 is slanted to facilitate the insertion of the protruded element into the recess element and to ultimately achieve the requisite optical alignment accuracy between the optoelectronic devices and the corresponding optical components.

In accordance to the disclosure, a batch assembly process is provided, in which a large number of optical alignments can be achieved. In other words, multiple optoelectronic devices can be optically and precisely aligned with the corresponding waveguides on the semiconductor bench. Further, the process of the disclosure can be realized with the application of the existing manufacturing techniques; hence, the demand for expensive high-precision systems can be obviated. Accordingly, not only a cost-effective assembly process is provided, the throughput is significantly enhanced.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A bonding system for alignment, comprising:
   an optical semiconductor, comprising:
     a light source; and
     a plurality of protruded elements extending above a surface of the optical semiconductor;
     a first metallized layer disposed on a surface of each protruded element of the plurality of protruded elements; and
   a semiconductor bench, comprising:
     a light receiving element, serving as an input terminal of the light source, wherein the light receiving element is aligned to the light source in a pressure applying direction;
     a plurality of recess elements extending downward from a surface of the semiconductor bench, wherein at least a sidewall of each protruded element of the plurality of protruded elements or a sidewall of each recess element of the plurality of recess elements is slanted;
     a second metallized layer disposed at a bottom surface of each recess element of the plurality of recess elements,
   wherein the optical semiconductor is integrated with the semiconductor bench by sliding the plurality of protruded elements correspondingly into the plurality of recess elements and by fusing the first metallized layer with the second metallized layer.

2. The bonding system for alignment of claim 1, wherein the optical semiconductor comprises a laser diode chip.

3. The bonding system for alignment of claim 1, wherein the light receiving element comprises an optical waveguide or an optical fiber.

4. The bonding system for alignment of claim 1, wherein each recess element of the plurality of recess elements is configured at a distance of less than 200 µm from the light receiving element and each protruded element of the plurality of protruded elements is configured at a distance of less than 200 µm from the light source.

5. The bonding system for alignment of claim 1, wherein two protruded elements of the plurality of protruded elements are configured diagonally with respect to the light source.

6. The bonding system for alignment of claim 1, wherein two recess elements are configured diagonally with respect to the light receiving element.

7. The bonding system for alignment of claim 1, wherein the sidewall of the each recess element of the plurality of recess elements intersect with a surface plane of the optical semiconductor at an acute angle.

8. The bonding system for alignment of claim 1, wherein a material constituting the first metallized layer and the second metallized layer comprises a eutectic solder material.

9. The bonding system for alignment of claim 1, wherein a material constituting the first metallized layer and the second metallized layer comprises gold, gold-tin alloy, or a gold-epoxy paste.

10. The bonding system for alignment of claim 1, wherein a depth of each recess element of the plurality of recess elements is less than or equal to 100 µm.

11. The bonding system of alignment of claim 1, wherein a side of the surface of each protruded element of the plurality of protruded elements is less than or equal to 50 µm.

12. A bonding method for optically coupling an optoelectronic device to an optical waveguide, the method comprising:
providing an optical semiconductor comprising a light emission element;
forming a plurality of protruded structures extending above a surface of the optical semiconductor, wherein a first metallized layer is formed on a surface of each protruded structure of the plurality of protruded structures;
providing a semiconductor bench comprising a light receiving element;
forming a plurality of recess elements on a surface of the semiconductor bench, wherein a second metallized layer is formed on a surface of each recess element, wherein at least a sidewall of each protruded element of the plurality of protruded elements or a sidewall of each recess element of the plurality of recess elements is slanted;
placing the optical semiconductor above the semiconductor bench and applying a force such that the plurality of protruded structures slides into the plurality of recess elements, respectively, wherein the light receiving element is aligned to the light emission element in a direction where the force is applied; and
performing a bonding process for bonding the first metallized layer and the second metallized layer together.

13. The bonding method of claim 12, wherein the bonding process is a thermal process.

14. The bonding method of claim 12, wherein the plurality of protruded structures and the plurality of recess elements are formed by photolithograph and etching processes.

15. The bonding method of claim 12, wherein each recess element of the plurality of recess elements is formed at a distance of less than 200 µm from the light receiving element.

16. The bonding method of claim 12, wherein the first metallized layer and the second metallized layer are formed with a eutectic solder material or a conductive adhesive.

17. The bonding method of claim 12, wherein the sidewall of the each protruded structure of the plurality of protruded structures is substantially normal to the surface of the optical semiconductor.

18. The bonding method of claim 12, wherein the sidewall of the each recess element of the plurality of recess elements is substantially normal to the surface of the semiconductor bench.

19. The bonding method of claim 12, wherein the light emission element comprises a laser.

20. The bonding method of claim 11, wherein the light receiving element comprises an optical waveguide or an optical fiber.

21. A bonding system for alignment, comprising:
an optical semiconductor, comprising:
a light source; and
a plurality of recess elements extending downward from a surface of the optical semiconductor;
a first metallized layer disposed on a surface of each recess element of the plurality of recess elements; and
a semiconductor bench, comprising:
a light receiving element, serving as an input terminal of the light source, wherein the light receiving element is aligned to the light source in a pressure applying direction;
a plurality of protruded elements extending above a surface of the semiconductor bench, wherein at least a sidewall of each protruded element of the plurality of protruded elements or a sidewall of the each recess element of the plurality of recess elements is slanted;
a second metallized layer disposed at a bottom surface of the each recess element of the plurality of recess elements,
wherein the optical semiconductor is integrated with the semiconductor bench by sliding the plurality of protruded elements correspondingly into the plurality of recess elements and by fusing the first metallized layer with the second metallized layer.

22. The bonding system for alignment of claim 21, wherein at least two protruded elements of the plurality of protruded elements are configured diagonally with respect to the light source, and at least two recess elements are configured diagonally with respect to the light receiving element.

23. The bonding system for alignment of claim 21, wherein the sidewall of the each recess element of the plurality of recess elements intersect with a surface plane of the optical semiconductor at an acute angle.

24. The bonding system of claim 21, wherein a material constituting the first metallized layer and the second metallized layer comprises a eutectic solder material or a conductive adhesive.

* * * * *